(12) United States Patent
Ballantine et al.

(10) Patent No.: US 7,332,054 B2
(45) Date of Patent: Feb. 19, 2008

(54) ETCH APPARATUS

(75) Inventors: Arne W. Ballantine, So. Burlington, VT (US); Scott A. Estes, Essex Junction, VT (US); Emily E. Fisch, Burlington, VT (US); Gary Milo, Williston, VT (US); Ronald A. Warren, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 222 days.

(21) Appl. No.: 10/760,896

(22) Filed: Jan. 20, 2004

(65) Prior Publication Data

US 2004/0144750 A1    Jul. 29, 2004

Related U.S. Application Data

(62) Division of application No. 09/326,514, filed on Jun. 4, 1999, now Pat. No. 6,699,400.

(51) Int. Cl.
*H01L 21/00*    (2006.01)
*B05C 3/00*    (2006.01)
*B05D 45/00*    (2006.01)

(52) U.S. Cl. .................. 156/345.11; 134/1.3; 134/902; 156/345.18

(58) Field of Classification Search .................. 134/10, 134/110, 111, 1.3, 902; 210/193, 198.1, 210/209, 149, 167, 177, 192; 156/345.11, 156/345, 345.18; 216/93
See application file for complete search history.

(56) References Cited

U.S. PATENT DOCUMENTS 5,075,641 A    12/1991    Weber et al.
5,348,617 A    9/1994    Braymen
5,352,350 A    10/1994    Andricacos et al.
5,372,653 A *    12/1994    Gray ........................... 134/26
5,472,562 A    12/1995    Ziger
5,501,767 A    3/1996    Sorensen et al.
5,730,162 A *    3/1998    Shindo et al. ................. 134/66
5,779,927 A *    7/1998    Lo .............................. 216/84
5,851,305 A *    12/1998    Yamada et al. ............... 134/10
5,965,015 A *    10/1999    Ronan et al. .................. 210/87

(Continued)

OTHER PUBLICATIONS

Definition of "connect" taken from www.m-w.com.*

(Continued)

*Primary Examiner*—Sylvia R. MacArthur
(74) *Attorney, Agent, or Firm*—Schmeiser, Olsen & Watts; William D. Sabo

(57) ABSTRACT

In a process using a hot phosphoric acid etchant (12) to etch silicon nitride on a semiconductor wafer (15) submerged in a tank (11) of the etchant (12), a recirculating path is established for the etchant (12). A porous filter (35) is coated with silicon nitride and installed in the recirculating path. As the etchant (12) in the recirculating path flows through the porous filter (35), the silicon nitride on the porous filter (35) dissolves into the etchant (12). In the tank (11), the silicon nitride dissolved in the etchant (12) significantly suppresses the etch of silicon dioxide on the semiconductor wafer (15), thereby enhancing the etch selectivity of the process. Monitoring and maintaining the concentration of the silicon nitride in the etchant (12) stabilizes the etch selectivity of the process.

12 Claims, 2 Drawing Sheets

U.S. PATENT DOCUMENTS

| | | | | |
|---|---|---|---|---|
| 5,979,474 | A * | 11/1999 | Manako | 134/102.1 |
| 5,993,663 | A * | 11/1999 | Maidagan Larrumbide | 210/666 |
| 6,059,886 | A * | 5/2000 | Shibano | 134/1 |
| 6,074,561 | A * | 6/2000 | Jablonsky | 210/650 |
| 6,156,107 | A * | 12/2000 | Hayashi et al. | 96/416 |
| 6,207,068 | B1 * | 3/2001 | Glick et al. | 216/93 |
| 6,255,123 | B1 | 7/2001 | Reis | |
| 6,287,983 | B2 | 9/2001 | Jan et al. | |
| 6,341,612 | B1 * | 1/2002 | Duckett et al. | 134/95.1 |
| 6,399,517 | B2 * | 6/2002 | Yokomizo et al. | 438/745 |

OTHER PUBLICATIONS

Merriam-Webster Dictionary, Tenth Edition, principal copyright 1993. "Connect", pp. 1 and 2.*

* cited by examiner

ETCH APPARATUS

This application is a divisional of Ser. No. 09/326,514; filed on Jun. 4, 1999 now U.S. Pat. No. 6,699,400.

FIELD OF THE INVENTION

The present invention relates, in general, to semiconductor device fabrication and, more particularly, to etch processes used in the fabrication of semiconductor devices.

BACKGROUND OF THE INVENTION

The fabrication of semiconductor devices and/or integrated circuits often requires removing certain materials from a semiconductor wafer while leaving other materials on the wafer. This can be accomplished in a selective etch process that uses an etchant having different etch rates with respect to different materials. To characterize the selective etch process, an etch selectivity is defined as the ratio of the etch rate of one material to the etch rate of another material. For example, an aqueous phosphoric acid solution having a concentration of approximately 85 percent heated to a temperature between 165 degrees Celsius (° C.) and 185° C. is routinely used for removing silicon nitride structures from a semiconductor wafer while leaving exposed silicon dioxide structures on the wafer. At the temperature of 165° C., the phosphoric acid solution etches silicon nitride at a rate of approximately 6 nanometers per minute and etches silicon dioxide at a rate of no more than 0.25 nanometers per minute. The resulting etch selectivity is at least 24:1.

The etch selectivity of an etch process depends on the temperature, concentration, and composition of the etchant. Consequently, the etch selectivity usually changes as more wafers are processed in the etchant. For example, the nitride to oxide etch selectivity of the etch process using the phosphoric acid etchant is approximately 24:1 when the etchant is fresh. After processing approximately 1000 wafers having silicon nitride thereon, the etch selectivity increases dramatically to 50:1 or greater. This selectivity variation adversely affects the efficiency, reliability, and yield of the semiconductor device and/or integrated circuit fabrication processes.

Accordingly, it would be advantageous to have an etch process that has a stable etch selectivity and an apparatus for performing the etch process. It is desirable for the etch process to have a high etch selectivity. It would be of further advantage if the etch apparatus can be adapted from existing etch apparatuses.

SUMMARY OF THE INVENTION

A general object of the present invention is to provide an efficient and reliable etch process and an apparatus for performing the etch process. It is a further object of the present invention for the etch process to be capable of producing semiconductor devices and/or integrated circuits having high performance, high reliability, and high yield. Another object of the present invention is to implement the etch process with modifications to existing etch apparatuses.

These and other objects of the present invention are achieved by adjusting and controlling the composition of the etchant during the etch process. For example, a selective etch modifier can be introduced into the etchant. The selective etch modifier alters the etch rates of certain materials but has no significant effect on the etch rates of other materials, thereby modifying the etch selectivity of the etch process. By monitoring and controlling the concentration of the etch rate modifier in the etchant, a stable etch selectivity is maintained during the etch process. The etch rate modifier can be either a selective etch intensifier or a selective etch rate suppressor. The selective etch intensifier selectively increases the etch rate of certain materials. On the other hand, the selective etch rate suppressor selective decreases the etch rate of certain materials.

In a preferred embodiment of the present invention, a hot phosphoric acid solution is used as the etchant for etching the silicon nitride on a semiconductor wafer. A recirculating path is established for the hot phosphoric acid etchant. A high surface area structure such as, for example, a carbon matrix filter is coated with silicon nitride. The carbon matrix filter is installed in the recirculating path for the etchant. As the etchant in the recirculating path flows through the carbon matrix filter, it dissolves the silicon nitride coated on the carbon matrix filter. The dissolved silicon nitride significantly reduces the etch rate of silicon dioxide on the semiconductor wafer. The etch rate of the silicon nitride on the semiconductor wafer is substantially unaffected by the presence of the silicon nitride in the etchant. Therefore, the silicon nitride dissolved in the hot phosphoric acid etchant functions as an etch rate modifier that enhances the etch selectivity of the etch process. More particularly, the dissolved silicon nitride functions as a selective etch rate suppressor that substantially inhibits the etch of silicon dioxide on the semiconductor wafer. The concentration of silicon nitride in the etchant can be monitored and adjusted to maintain a stable etch selectivity of the etch process.

DETAILED DESCRIPTION OF THE PREFERRED EMBODIMENTS

Figure 1:
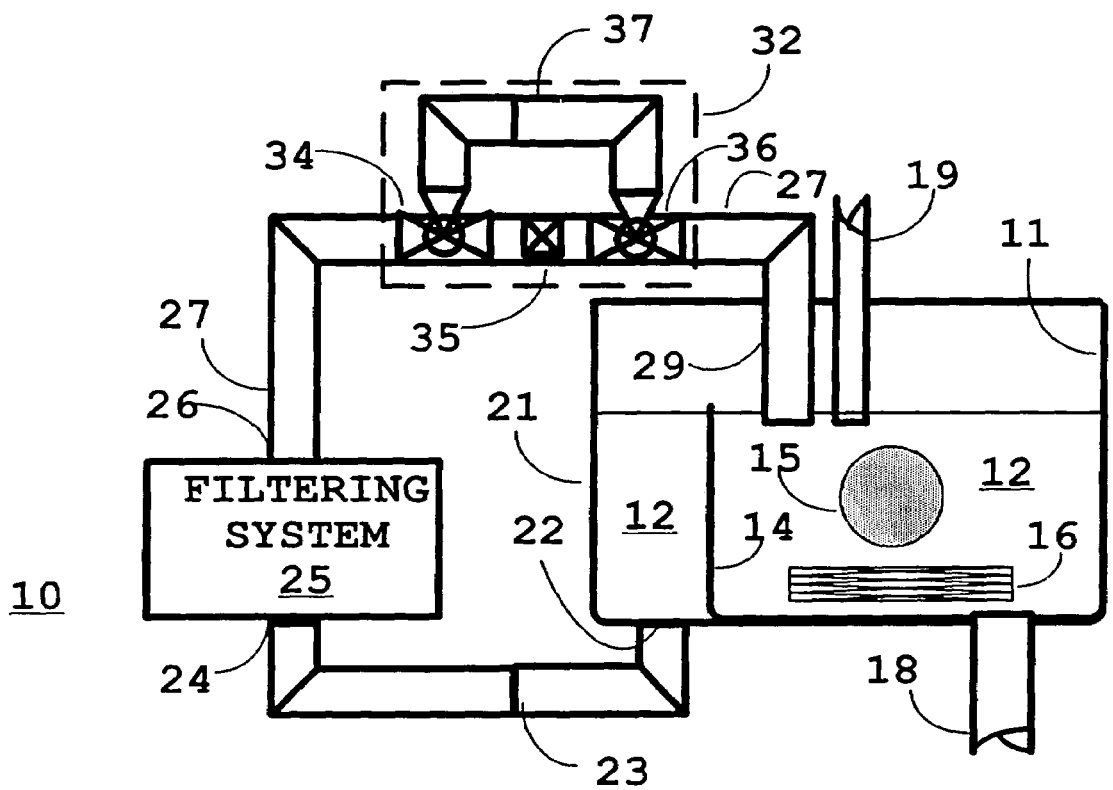
FIG. 1 is a schematic diagram of an etch apparatus in accordance with the present invention.

Preferred embodiments of the present invention are described herein with reference to the figures. It should be noted that the figures are not necessarily drawn to scale. It should also be noted that elements having similar functions are labeled using the same reference numerals in the figures.

FIG. 1 is a schematic diagram of an apparatus 10 used in a wet etch process in accordance with the present invention. Apparatus 10 is also referred to as a wet etcher or simply an etcher. Etcher 10 includes a tank 11 filled with an etchant 12. Tank 11 and etchant 12 form an etchant bath for etching an object, e.g., a semiconductor wafer 15, submerged in the etchant bath. Tank 11 filled with etchant 12 is also referred to as a bath 11 of etchant 12. A heating element 16 such as, for example, a filament is immersed in etchant 12 for adjusting and maintaining the temperature of etchant 12 during the etch process. Tank 11 has a drain 18. In a semiconductor device fabrication process, old and contaminated etchant is periodically removed from tank 11 through drain 18 and tank 11 is then filled with new etchant. A spout 19 is connected to a source of deionized water (not shown) and provides tank 11 with deionized water, thereby adjusting the concentration of etchant 12. Etcher 10 also includes a chamber 21 attached to a sidewall 14 of tank 11. Chamber 21 has an outlet 22 at its bottom. A conduit 23 couples outlet 22 of chamber 21 to an inlet 24 of a filtering system 25. Another conduit 27 has a first end connected to an outlet 26 of filtering system 25 and a second end mounted adjacent to tank 11. During an etch process, etchant 12 in tank 11 overflows sidewall 14 into chamber 21. Etchant 12 in chamber 21 is pumped back to tank 11 through conduit 23, filtering system 25, and conduit 27. Therefore, chamber 21, conduit 23, filtering system 25, and conduit 27 form a recirculating path for etchant 12 in tank 11. The second end of conduit 27 serves as an outlet 29 of the recirculating path. Because etchant 12 in tank 11 reaches chamber 21 by overflowing sidewall 14, sidewall 14 is also referred to as an overflow sidewall and chamber 21 is also referred to as an overflow chamber or an overflow compartment. Overflow chamber 21 communicates with tank 11 through overflow sidewall 14.

In addition, etcher 10 includes a substance dissolving system 32 in the recirculating path for etchant 12. During an etch process, substance dissolving system 32 introduces a substance into etchant 12 to modify the characteristics of etchant 12, thereby achieving a desired result such as, for example, a high etch selectivity, a stable etch selectivity, a contamination free etch process, etc. The type and quantity of the substance introduced into etchant 12 depend on the composition of etchant 12 and the desired result. Substance dissolving system 32 is installed between the two ends of conduit 27 and includes a split valve 34, a dissolver 35, a bypass conduit 37, and a merge valve 36. Split valve 34 has one inlet and two outlets. Merge valve 36 has two inlets and one outlet. The inlet of split valve 34 is coupled to the outlet 26 of filtering system 25 via a section of conduit 27. Dissolver 35 has an inlet connected to the first outlet of split valve 34 and an outlet connected the first inlet of merge valve 36. The second outlet of split valve 34 is coupled to the second inlet of merge valve 36 via bypass conduit 37. The outlet of merge valve 36 is coupled to outlet 29 of the recirculating path via another section of conduit 27. Split valve 34 and merge valve 36 control the partition of etchant 12 flowing through dissolver 35 and through bypass conduit 37.

Preferably, dissolver 35 has a high surface area coated with the substance to be introduced into etchant 12 during the etch process. In a preferred embodiment, dissolver 35 is formed by depositing the substance on a porous structure such as, for example, a carbon matrix filter. When etchant 12 in the recirculating path flows through dissolver 35, the substance deposited on the porous filter is dissolved in etchant 12.

The dissolution rate at which etchant 12 dissolves the substance deposited on the porous filter can be controlled by adjusting the temperature of etchant 12 flowing through the porous filter. Preferably, substance dissolving system 32 includes a temperature controller (not shown), e.g., a heating coil and a cooling coil, for adjusting the temperature of etchant 12 flowing through the porous filter. An alternative method for controlling the dissolution rate is changing the surface area of the porous filter exposed to etchant 12. This can be achieved by partially submerging the porous filter in etchant 12 flowing through substance dissolving system 32 and adjusting the extent to which the porous filter is submerged in etchant 12. The dissolution rate can also be controlled by adjusting the rate at which etchant 12 flows through the porous filter. The flow rate of etchant 12 through the porous filter can be controlled by adjusting split valve 34, merge valve 36, and a pump (not shown) in the recirculating path. Further, etchant 12 adjacent dissolver 35 may be saturated with the substance dissolved from the surface of the porous filter. This may adversely affect the etch process. Therefore, substance dissolving system 32 preferably includes a flushing system (not shown) that can be periodically turned on to flush dissolver 35.

Figure 2:
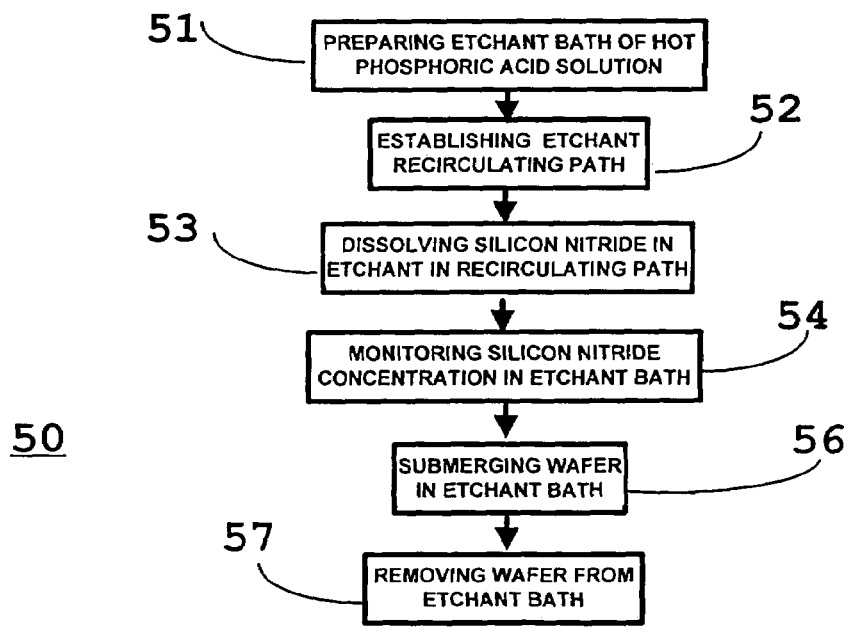
FIG. 2 is a flow chart schematically illustrating an etch process in accordance with the present invention.

FIG. 2 is a flow chart schematically illustrating an etch process 50 in accordance with the present invention. By way of example, etch process 50 is a wet etch process using etcher 10 of FIG. 1 for etching silicon nitride structures and/or polycrystalline silicon structures on semiconductor wafer 15. In a semiconductor device fabrication process, silicon nitride structures are formed on semiconductor wafer 15. Typically, a pad layer of silicon dioxide is formed between the silicon nitride structures and the surface of semiconductor wafer 15 to relieve the tension on the wafer surface. Other structures such as, for example, polycrystalline silicon structures can also be formed on semiconductor wafer 15. Preferably, the silicon dioxide layer on semiconductor wafer 15 remains in place after etch process 50 so that it can protect the underlying films or retain a uniform thickness for consistent performance of the semiconductor devices fabricated on semiconductor wafer 15. Therefore, etch process 50 preferably has a high and stable etch selectivity so that and the etch of the silicon dioxide pad layer on semiconductor wafer 15 is substantially inhibited.

Etchant 12 for etching silicon nitride and/or polycrystalline silicon on semiconductor wafer 15 is preferably an aqueous solution of phosphoric acid having a concentration of approximately 85 percent and a temperature between approximately 165 degrees Celsius (° C.) and approximately 185° C. Silicon nitride is deposited on a high surface area structure such as, for example, a carbon matrix filter, which serves as dissolver 35 in substance dissolving system 32. Etchant 12 dissolves the silicon nitride deposited on the carbon matrix filter as it flows through dissolver 35. In tank 11, the silicon nitride dissolved in etchant 12 alters the composition and modifies the characteristics of etchant 12. More particularly, the silicon nitride reacts with the phosphoric acid in etchant 12 in a chemical reaction:

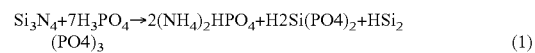

The silicon phosphate acid compounds formed in the reaction are not volatile, so etchant 12 does not lose significant amounts of the silicon phosphate acid compounds through evaporation. However, the silicon phosphate acid compounds are unstable. They react with the water in etchant 12 as described in the following equations:

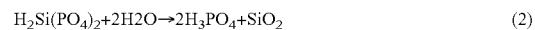

Therefore, the series of chemical reactions described by equations (1), (2), and (3) can be described by the following equation:

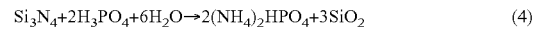

The silicon dioxide formed in etchant 12 suppresses the etch of the silicon dioxide on semiconductor wafer 15 and has no significant effect on the etch rate of silicon nitride and polycrystalline silicon. The etch selectivity of etch process 50 is significantly increased. Therefore, the silicon nitride deposited on the carbon matrix filter in substance dissolving system 32 functions as a selective etch rate suppressor during etch process 50.

Etch process 50 starts with preparing an etchant bath (step 51) by filling tank 11 in etcher 10 with etchant 12 so that etchant 12 overflows sidewall 14 and spills into overflow chamber 21. Heating element 16 in tank 11 maintains etchant 12 at a desired temperature, e.g., approximately 165° C., at which temperature the phosphoric acid solution loses its water component through evaporation. Spout 19 continuously adds deionized water into tank 11 to make up the water lost through evaporation, thereby maintaining a substantially constant concentration of etchant 12.

A pump (not shown) pumps etchant 12 in chamber 21 through filtering system 25 and substance dissolving system 32 to establish a recirculating path for etchant 12 (step 52). The pump also controls the recirculating rate of etchant 12. Filtering system 25 reconditions etchant 12 throughout etch process 50 by filtering out contaminants that may be present in etchant 12.

When etchant 12 flows through dissolver 35 in substance dissolving system 32, the silicon nitride deposited on the carbon matrix filter is gradually dissolved in etchant 12 and introduced into tank 11 through outlet 29 of the recirculating path (step 53). The silicon nitride dissolved in etchant 12 changes the characteristics of etchant 12. More particularly, the silicon nitride functions as a selective etch rate suppressor to enhance the etch selectivity of etchant 12.

The introduction of the silicon nitride into etchant 12 continues while semiconductor wafer 15 is submerged in tank 11 of etchant 12. The concentration of the silicon nitride selective etch rate suppressor in etchant 12 determines the etch selectivity of etch process 50. Preferably, the concentration of the selective etch rate suppressor is sufficiently high to substantially quench or inhibit the etch of silicon dioxide on semiconductor wafer 15. It should be noted that a very high silicon nitride concentration in etchant 12 may produce too much silicon dioxide in etchant 12, thereby causing an undesirable effect of silicon dioxide precipitating on semiconductor wafer 15. Preferably, an equilibrium between the consumption and production of silicon dioxide in etchant 12 is maintained at an appropriate level to achieve an etch selectivity approaching infinity while substantially inhibiting any silicon dioxide deposition on semiconductor wafer 15. A desired equilibrium is achieved when the selective etch rate suppressor concentration in etchant 12 is, by way of example, approximately 0.5 milligram of silicon nitride per milliliter of the phosphoric acid solution. At this concentration, the etch selectivity of etch process 50 approaches infinity to one and there is no significant silicon dioxide precipitation on semiconductor wafer 15 during etch process 50.

The concentration of the selective etch rate suppressor in etchant 12 (step 54) is monitored. In one embodiment, the concentration of the selective etch rate suppressor is monitored by measuring the etch rates of the silicon nitride structures and the silicon dioxide structures on monitoring wafers (not shown) in etchant 12. In another embodiment, the concentration of the selective etch rate suppressor is monitored by measuring the ammonium cation concentration in etchant 12. As described in equations (1) and (4) above, the ammonium cation concentration in the phosphoric acid solution depends on the dissolved silicon nitride concentration in etchant 12. Methods for measuring the ammonium cation concentration include cation ion chromatography and ammonia selective electrode measurement.

Adjustments are made to etchant 12 if the monitoring scheme indicates that the concentration of the selective etch rate suppressor therein is not optimal. If the concentration of the selective etch rate suppressor in etchant 12 is too low, the dissolution rate of the silicon nitride deposited on the carbon matrix filter is increased. This can be accomplished by increasing the temperature of etchant 12 flowing through dissolver 35, increasing the surface area of dissolver 35 in etchant 12, and/or increasing the flow rate of etchant 12 through dissolver 35. If the concentration of the selective etch rate suppressor in etchant 12 is too high, the temperature and/or the flow rate of etchant 12 through dissolver 35 are decreased to reduce the dissolution rate of the silicon nitride deposited on the carbon matrix filter in etchant 12. The dissolution rate can also be reduced by decreasing the surface area of dissolver 35 exposed to etchant 12 flowing through substance dissolving system 32. The temperature of etchant 12 flowing through dissolver 35 is adjusted using a temperature adjusting element or an etchant temperature controller (not shown), e.g., heating coil and a cooling coil, in substance dissolving system 32. The flow rate of etchant 12 through dissolver 35 can be controlled by adjusting the recirculating rate of etchant 12. The flow rate of etchant 12 through dissolver 35 can also be controlled by adjusting split valve 34 and merge valve 36 to alter the ratio of etchant 12 flowing through dissolver 35 with respect to that flowing through bypass conduit 37. Split valve 34 and merge valve 36 are preferably capable of directing all etchant 12 in the recirculating path through dissolver 35, thereby maximizing the dissolution rate of silicon nitride into etchant 12. Likewise, split valve 34 and merge valve 36 are also preferably capable of directing all etchant 12 flowing in the recirculating path through bypass conduit 37, thereby achieving a substantially zero dissolution rate of silicon nitride into etchant 12. The dissolution rate of the silicon nitride deposited on dissolver 35 into etchant 12 can also be adjusted by periodically flushing dissolver 35 with deionized water.

After an appropriate silicon nitride concentration in etchant 12 is achieved, semiconductor wafer 15 is submerged in etchant 12 in tank 11 (step 56). Usually, semiconductor wafer is mounted on a cassette (not shown). The cassette includes a plurality of wafers mounted thereon. The wafers mounted on a cassette are referred to as a batch of wafers. By way of example, a batch typically includes between 15 and 20 wafers. Preferably, the wafers in a batch are substantially identical to each other. In tank 11, the silicon nitride and/or polycrystalline silicon structures on semiconductor wafer 15 are etched by the hot phosphoric acid. The etch of silicon dioxide on semiconductor wafer 15 is greatly suppressed or substantially inhibited by the selective etch rate suppressor in etchant 12.

When a desired etch result is achieved, etch process 50 ends by removing semiconductor wafer 15 from tank 11 of etchant 12 (step 57). Preferably, steps 52, 53, and 54 described herein above and shown in the flow chart of FIG. 2 continue after semiconductor wafer 15 is removed from tank 11 to maintain etchant 12 in tank 11 in an optimal condition. Etcher 10 is ready for receiving the next batch of wafers. If etchant 12 is so contaminated that its continual use may adversely affect the performance, reliability, or yield of the semiconductor devices on semiconductor wafer 15, it is discharged from etcher 10 through drain 18 at the bottom of tank 11. Tank 11 is then filled with new and clean etchant 12. Filtering system 25 and dissolver 35 may also need replacement from time to time. Further, the whole apparatus of etcher 10, which includes tank 11, chamber 21, conduits 23 and 27, filtering system 25, and substance dissolving system 32, may need to be cleansed after a prolonged use.

Figure 3:
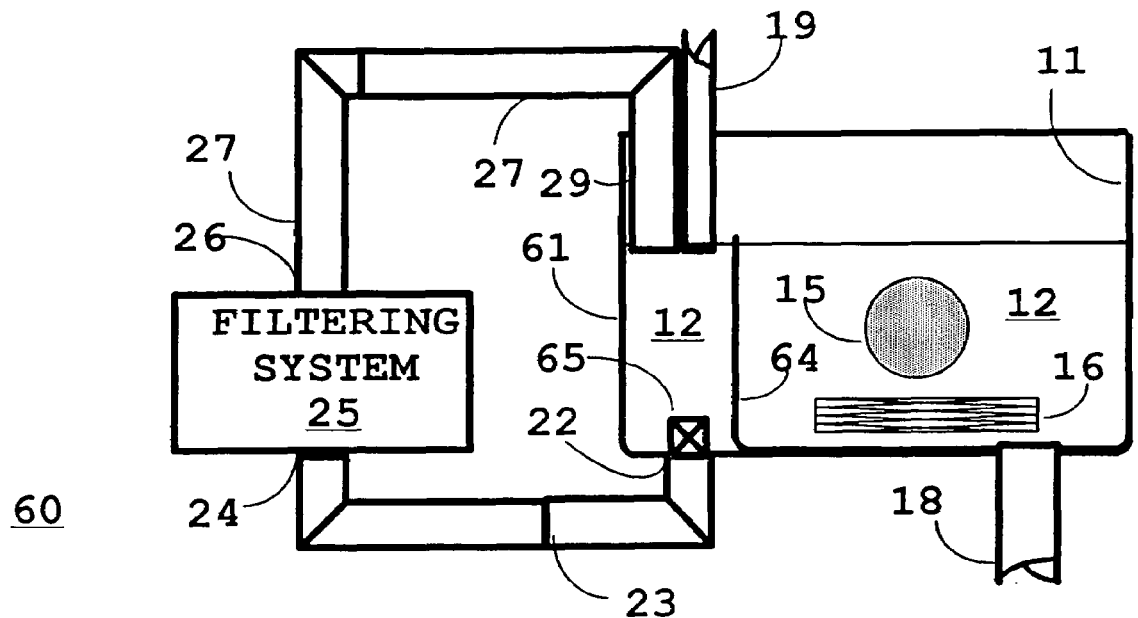
FIG. 3 is a schematic diagram of another etch apparatus in accordance with the present invention.

FIG. 3 is a schematic diagram of another etch apparatus 60 in accordance with the present invention. Apparatus 60 is also referred to as a wet etcher or simply an etcher. Etcher 60 is structurally similar to etcher 10 shown in FIG. 1 and includes a tank 11 filled with an etchant 12 and a deionized water supply spout 19. Etcher 60 also includes a recirculating path comprised of a chamber 61, a conduit 23, a filtering system 25, and a conduit 27.

A difference between etcher 10 of FIG. 1 and etcher 60 is that substance dissolving system 32 installed between filtering system 25 and outlet 29 of the recirculating path of etcher 10 is absent in etcher 60. Instead, etcher 60 includes a dissolver 65 in chamber 61 adjacent to outlet 22. Like dissolver 35 in etcher 10, dissolver 65 preferably includes a high surface area object coated with the substance to be introduced into etchant 12. For example, when etcher 60 is used for etching silicon nitride on semiconductor wafer 15, dissolver 65 can include a carbon matrix filter with silicon nitride deposited thereon. The silicon nitride dissolved in etchant 12 during an etch process functions as a selective etch rate suppressor to substantially inhibit the etch of silicon dioxide on semiconductor wafer 15. In an etch process using etcher 60, dissolution rate of the silicon nitride on dissolver 65 is controlled by adjusting the temperature and the recirculating rate of etchant 12.

Another difference between etcher 10 shown in FIG. 1 and etcher 60 is that in etcher 60, chamber 61 is attached to a permeable sidewall 64 of tank 11. Etchant 12 in tank 11 flows into chamber 61 either through permeable sidewall 64 or by overflowing permeable sidewall 64. In other words, chamber 61 communicates with tank 11 through permeable sidewall 64. Additional differences include the locations of deionized water supply spout 19 and outlet 29 of the recirculating path. In etcher 60, deionized water supply spout 19 and outlet 29 of the recirculating path are located in chamber 61. Therefore in etcher 60, recirculated etchant 12 and deionized water are supplied to tank 11 via chamber 61 and through permeable sidewall 64 between chamber 61 and tank 11.

Figure 4:
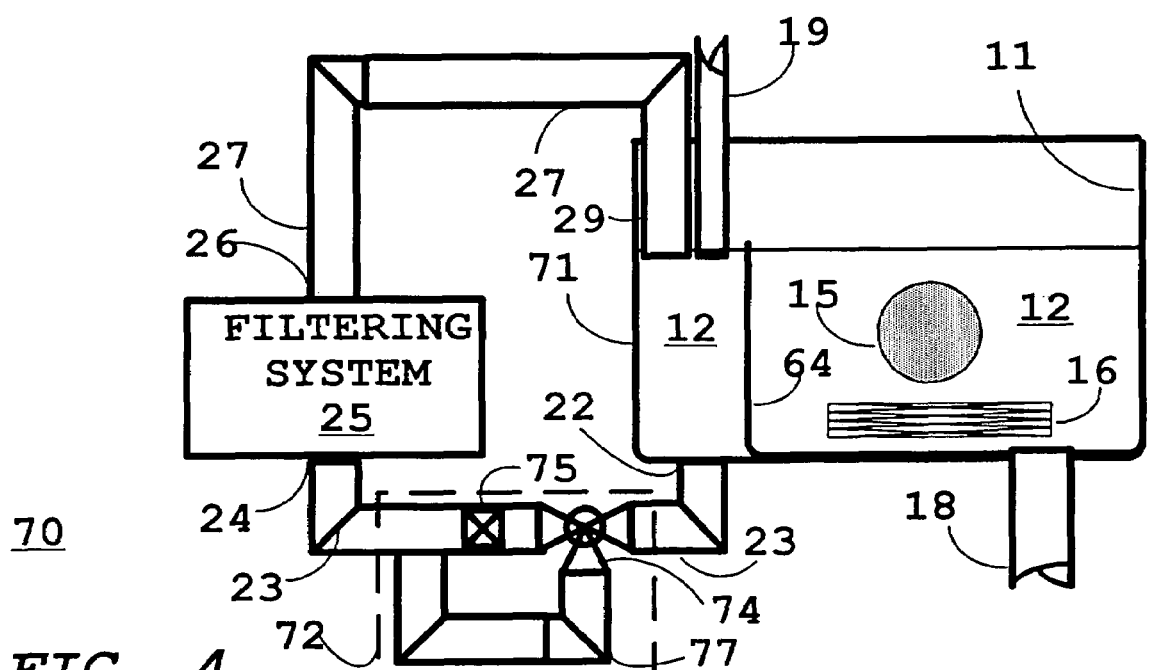
FIG. 4 is a schematic diagram of yet another etch apparatus in accordance with the present invention.

FIG. 4 is a schematic diagram of yet another etch apparatus 70 in accordance with the present invention. Apparatus 70 is also referred to as a wet etcher or simply an etcher. Etcher 70 is structurally similar to etcher 10 shown in FIG. 1 and includes a tank 11 filled with an etchant 12 and a deionized water supply spout 19. Etcher 70 also includes a recirculating path comprised of a chamber 71, a conduit 23, a filtering system 25, and a conduit 27.

A difference between etcher 10 of FIG. 1 and etcher 70 is that substance dissolving system 32 installed between filtering system 25 and outlet 29 of the recirculating path of etcher 10 is absent in etcher 70. Instead, etcher 70 includes a substance dissolving system 72 installed between outlet 22 of chamber 71 and inlet 24 of filtering system 25. Substance dissolving system 72 is comprised of a split valve 74, a dissolver 75, and a bypass conduit 77. Split valve 74 has one inlet and two outlets. The inlet of split valve 74 is coupled to the outlet 22 of chamber 71 via a section of conduit 23. An inlet of dissolver 75 is connected to the first outlet of split valve 74. Another section of conduit 23 couples an outlet of dissolver 35 to inlet 24 of filtering system 25. Bypass conduit 77 is coupled between the second outlet of split valve 74 and inlet 24 of filtering system 25. Split valve 74 controls the partition of etchant 12 in the recirculating path flowing through dissolver 75 and through bypass conduit 77.

Like dissolver 35 in etcher 10, dissolver 75 preferably includes a high surface area structure coated with the substance to be introduced into etchant 12 during the etch process. In a preferred embodiment, dissolver 75 is formed by depositing the substance on a porous filter such as, for example, a carbon matrix filter. When etchant 12 in the recirculating path flows through dissolver 75, the substance deposited on the porous filter is dissolved in etchant 12.

The dissolution rate can be controlled by adjusting the temperature of etchant 12 flowing through dissolver 75. Like substance dissolving system 32 in etcher 10, substance dissolving system 72 preferably includes a temperature controller (not shown), e.g., a cooling coil, for adjusting the temperature of etchant 12 flowing through dissolver 75. The dissolution rate can also be controlled by adjusting the rate at which etchant 12 flows through dissolver 75. The flow rate of etchant 12 through dissolver 75 can be controlled by adjusting split valve 74 and/or a pump (not shown) in the recirculating path. Further, substance dissolving system 72 preferably includes a flushing system (not shown) that can be periodically turned on to flush etchant 12 near dissolver 75.

Another difference between etcher 10 shown in FIG. 1 and etcher 70 is that in etcher 70, chamber 71 is attached to a permeable sidewall 64 of tank 11. Etchant 12 in tank 11 flows into chamber 71 either through permeable sidewall 64 or by overflowing permeable sidewall 64. In other words, chamber 71 communicates with tank 11 through permeable sidewall 64. Additional differences include the locations of deionized water supply spout 19 and outlet 29 of the recirculating path. In etcher 70, deionized water supply spout 19 and outlet 29 of the recirculating path are located in chamber 71. Therefore in etcher 70, recirculated etchant 12 and deionized water are supplied to tank 11 via chamber 71 and through permeable sidewall 64 between chamber 71 and tank 11.

By now it should be appreciated that an etch process and an apparatus for performing the etch process have been provided. In accordance with the present invention, a selective etch rate suppressor is introduced into the etchant bath during the etch process to increase the etch selectivity of the etch process. For example, in an etch process using hot phosphoric acid etchant to etch silicon nitride on a semiconductor wafer, silicon nitride is introduced into the etchant as the selective etch rate suppressor. The silicon nitride in the phosphoric acid etchant significantly decreases the etch rate of silicon dioxide on the semiconductor wafer. Preferably, the silicon nitride is introduced into the etchant using a filter coated with the silicon nitride and installed in the recirculating path for the etchant. The silicon nitride is dissolved in the etchant while the etchant in the recirculating path flows through the filter. When the etchant flows back to the etchant bath, the silicon nitride is substantially completely dissolved in the etchant, thereby substantially eliminating the particulate deposition of the silicon nitride on the semiconductor wafer. The silicon nitride concentration in the etchant is monitored and maintained at a desirable level by adjusting the temperature and flow rate of the etchant through the filter. The etch process of the present invention is efficient and reliable. The increased and stabilized etch selectivity improves the performance, reliability, and yields of semiconductor devices and/or integrated circuits fabricated using the etch process of the present invention.

While specific embodiments of the present invention have been shown and described, further modifications and improvements will occur to those skilled in the art. For example, the selective etch rate suppressor is not limited to being coated on a porous filter in the recirculating path of the etchant and dissolved in the etchant as the etchant flows through the filter. The selective etch rate modifier can be introduced into the etchant in powder form. The powder can be either added directly into the etchant bath, or introduced into the etchant in the recirculating path. Further, the application of the present invention is not limited to enhancing the etch selectivity of an etch process. The principle of the present invention is applicable to other processes whose characteristics are improved by introducing a material not required for the process itself. This process improvement is not limited to etch selectivity enhancement. For example, in a hydrofluoric acid based etch process for etching silicon dioxide on a semiconductor wafer, silicon can be coated on a filter installed in the etchant recirculating path and introduced into the etchant as the etchant flows through the recirculating path. The silicon serves to getter copper contamination. More particularly, the silicon removes the copper from the etchant, thereby avoiding the copper being deposited on the exposed silicon on the semiconductor wafer and contaminating the wafer surface.

The invention claimed is:

1. An etch apparatus, comprising:
   an etchant comprising a phosphoric acid solution;
   a silicon-nitride etching tank containing the etchant, said etchant configured to perform a selective etching of a semiconductor structure in the tank in contact with the etchant, wherein the semiconductor structure comprises a semiconductor wafer, a pad layer comprising silicon dioxide, and a silicon nitride structure comprising silicon nitride, wherein the pad layer is on a surface of the semiconductor wafer, wherein the silicon nitride structure is on the pad layer, wherein the pad layer is disposed between the semiconductor wafer and the silicon nitride structure, wherein said selective etching is characterized by the silicon nitride of the silicon nitride structure being selectively etched by the etchant relative to an etching by the etchant of the silicon dioxide of the pad layer; and
   a recirculating path coupled to said tank, wherein the recirculating path comprises a chamber, a first conduit, a filtering system, a dissolver, and a second conduit,
   wherein the chamber is in direct mechanical contact with the tank,
   wherein a first end of the first conduit is connected to an outlet of the chamber,
   wherein an inlet of the filtering system is connected to a second end of the first conduit, wherein an outlet of the filtering system is connected to a first end of the second conduit,
   wherein a second end of the second conduit is connected to the tank or the chamber,
   wherein the recirculating path is configured to receive an overflow of the etchant from the tank into the chamber and to flow the etchant from the chamber through the first conduit, the filtering system, the second conduit, and back into the tank,
   wherein the dissolver comprises a porous carbon matrix filter having only silicon nitride coated thereon,
   wherein the etch apparatus further comprises means for dissolving the silicon nitride coated on the filter into the etchant at a controlled dissolution rate sufficient to cause said selective etching to decrease an etch rate of the silicon dioxide of the pad layer in the etchant in a controlled manner such that an etch rate of silicon nitride of the silicon nitride structure is substantially unchanged,
   wherein the etch apparatus further comprises means for coating the silicon nitride onto the filter to configure the coated silicon nitrate to facilitate said selective etching,
   wherein the silicon nitride coated on the filter has a different spatial distribution on the filter than would silicon nitride coated on the filter by being precipitated from the etchant onto the filter while the etchant is passing through the filter.

2. The etch apparatus of claim 1, wherein the tank comprises a heating element for heating and adjusting a temperature of the etchant, and wherein the heater is immersed in the etchant.

3. The etch apparatus of claim 1, wherein the second end of the second conduit is connected to the chamber, wherein the dissolver is disposed in the chamber at a location in the chamber where the outlet of the chamber is connected to the first end of the first conduit, wherein a permeable sidewall is disposed between the tank and the chamber, and wherein the etchant flows from the tank to the chamber by flowing through the permeable sidewall and/or by overflowing the permeable sidewall.

4. The etch apparatus of claim 3, wherein the etchant flows from the tank to the chamber by flowing through the permeable sidewall.

5. The etch apparatus of claim 3, wherein the etchant flows from the tank to the chamber by overflowing the permeable sidewall.

6. The etch apparatus of claim 1, wherein the second end of the second conduit is connected to the chamber, wherein a permeable sidewall is disposed between the tank and the chamber, wherein the etchant flows from the tank to the chamber by flowing through the permeable sidewall and/or by overflowing the permeable sidewall, and wherein the etch apparatus further includes:
   a split valve within the first conduit: and
   a bypass conduit external to the first conduit, wherein a first end of the bypass conduit is connected to the split valve and a second end of the bypass conduit is connected to a merge location in the first conduit, wherein the dissolver is disposed within the first conduit between the split valve and the merge location, wherein the split valve is configured to split the etchant flowing into the split valve from the first end of the first conduit into a first etchant component flowing through the filter and a second etchant component flowing through the bypass conduit, and wherein the second etchant component merges with the first etchant at the merge location into a merged etchant flowing into the second end of the first conduit and into the inlet of the filtering system.

7. The etch apparatus of claim 6, wherein the etchant flows from the tank to the chamber by flowing through the permeable sidewall.

8. The etch apparatus of claim 6, wherein the etchant flows from the tank to the chamber by overflowing the permeable sidewall.

9. The etch apparatus of claim 1, wherein the etch apparatus further includes:
   a split valve within the second conduit;
   a merge valve within the second conduit, wherein the dissolver is disposed within the second conduit between the split valve and the merge valve, wherein the merge valve is closer to the second end of the second conduit than is the split valve, and wherein the second end of the second conduit is connected to the tank; and
   a bypass conduit connecting the split valve to the merge valve, wherein the bypass conduit is external to the second conduit, wherein the split valve is configured to split the etchant flowing into the split valve from the first end of the second conduit into a first etchant component flowing through the filter and a second etchant component flowing through the bypass conduit, and wherein the merge valve is configured to merge the first etchant component flowing through the filter and the second etchant component flowing through the bypass conduit into a merged etchant flowing into the second end of the second conduit and into the tank.

10. The etch apparatus of claim 1, further comprising an etchant temperature controller adjacent said dissolver, said etchant temperature controller adjusting a temperature of the etchant flowing through said dissolver.

11. The etch apparatus of claim 1, further comprising a spout for providing deionized water to the tank to adjust the concentration of the etchant in the tank, wherein the spout is directly connected to the chamber.

12. The etch apparatus of claim 1, wherein the sufficiently controlled dissolution rate generates a concentration of silicon nitride in the etchant of about 0.5 milligrams of silicon nitride per milliliter of phosphoric acid.

* * * * *